(12) United States Patent
Hirata

(10) Patent No.: US 10,870,176 B2
(45) Date of Patent: Dec. 22, 2020

(54) SIC WAFER PRODUCING METHOD

(71) Applicant: DISCO CORPORATION, Tokyo (JP)

(72) Inventor: Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 552 days.

(21) Appl. No.: 15/714,574

(22) Filed: Sep. 25, 2017

(65) Prior Publication Data

US 2018/0085851 A1 Mar. 29, 2018

(30) Foreign Application Priority Data

Sep. 29, 2016 (JP) .................................. 2016-190952

(51) Int. Cl.
| | |
|---|---|
| *B23K 26/53* | (2014.01) |
| *B23K 26/06* | (2014.01) |
| *B23K 26/38* | (2014.01) |
| *B23K 26/40* | (2014.01) |
| *B23K 103/00* | (2006.01) |

(52) U.S. Cl.
CPC .......... *B23K 26/53* (2015.10); *B23K 26/0626* (2013.01); *B23K 26/38* (2013.01); *B23K 26/40* (2013.01); *B23K 2103/56* (2018.08)

(58) Field of Classification Search
CPC ..... B23K 26/53; B23K 26/0626; B23K 26/40
USPC ....... 219/121.7; 451/7, 8, 54; 117/13, 19, 20
See application file for complete search history.

(56) References Cited

U.S. PATENT DOCUMENTS

| | | | | |
|---|---|---|---|---|
| 8,758,087 B2 * | 6/2014 | Koutake | .............. | B28D 5/0082 451/54 |
| 9,018,639 B2 * | 4/2015 | Loboda | ............. | H01L 21/02021 257/77 |

FOREIGN PATENT DOCUMENTS

| | | | | |
|---|---|---|---|---|
| JP | 2000-094221 | | 4/2000 | |
| JP | 2013-049161 | | 3/2013 | |
| JP | 2013049161 | * | 3/2013 | ............. B23K 26/00 |

OTHER PUBLICATIONS

Machine Translation of JP2013049161 (Year: 2019).*

* cited by examiner

*Primary Examiner* — Tu B Hoang
*Assistant Examiner* — Thomas J Ward
(74) *Attorney, Agent, or Firm* — Greer Burns & Crain Ltd.

(57) ABSTRACT

A SiC wafer is produced from a single crystal SiC ingot. A modified layer is formed by setting a focal point of a pulsed laser beam inside the ingot at a predetermined depth from the upper surface of the ingot, the predetermined depth corresponding to the thickness of the wafer to be produced. The pulsed laser beam is applied to the ingot while moving the ingot in a first direction perpendicular to a second direction where an off angle is formed, thereby forming a modified layer in the first direction inside the ingot and cracks propagating from the modified layer along a c-plane. A separation surface is formed by indexing the ingot in the second direction and applying the laser beam plural times to thereby form a separation surface inside the ingot. Part of the ingot is separated along the separation surface to thereby produce the wafer.

2 Claims, 6 Drawing Sheets

US 10,870,176 B2

SIC WAFER PRODUCING METHOD

BACKGROUND OF THE INVENTION

Field of the Invention

The present invention relates to an SiC wafer producing method for producing an SiC wafer from a single crystal SiC ingot.

Description of the Related Art

Various devices such as integrated circuits (ICs), large-scale integrations (LSIs), and light-emitting diodes (LEDs) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips each corresponding to the devices. The device chips thus obtained are used in various electrical equipment such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-open No. 2000-94221). However, when the ingot is cut by the wire saw and both side of each wafer are polished to obtain the product, a large proportion (70% to 80%) of the ingot is discarded to cause a problem of poor economy. In particular, a single crystal SiC ingot has high Mohs hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

A technique for solving this problem has been proposed (see Japanese Patent Laid-open No. 2013-49161). This technique includes the steps of setting the focal point of a laser beam having a transmission wavelength to SiC inside an SiC ingot, next applying the laser beam to the SiC ingot as scanning the laser beam on the ingot to thereby form modified layers in a separation plane previously set inside the ingot, and next breaking the ingot along the separation plane where the modified layers are formed, thus separating an SiC wafer from the SiC ingot.

SUMMARY OF THE INVENTION

However, in producing the SiC wafer from the SiC ingot by using the prior art technique disclosed in Japanese Patent Laid-open No. 2013-49161, there is a problem such that the modified layers must be densely formed with a pitch of approximately 10 µm, causing a reduction in productivity.

It is therefore an object of the present invention to provide an SiC wafer producing method which can improve the productivity of wafers.

In accordance with an aspect of the present invention, there is provided an SiC wafer producing method for producing an SiC wafer from a single crystal SiC ingot having a first surface, a second surface opposite to the first surface, a c-axis extending from the first surface to the second surface, and a c-plane perpendicular to the c-axis, the c-axis being inclined by an off angle with respect to a normal to the first surface, the off angle being formed between the c-plane and the first surface, the SiC wafer producing method including a modified layer forming step of setting a focal point of a pulsed laser beam having a transmission wavelength to SiC inside the SiC ingot at a predetermined depth from the first surface, the predetermined depth corresponding to the thickness of the SiC wafer to be produced, and next applying the pulsed laser beam to the SiC ingot as relatively moving the SiC ingot and the focal point in a first direction perpendicular to a second direction where the off angle is formed, thereby forming a linear modified layer inside the SiC ingot at the predetermined depth so as to extend in the first direction and cracks extending from the modified layer in opposite directions along the c-plane, the modified layer being formed in such a manner that SiC is decomposed into Si and C by the pulsed laser beam first applied, and the pulsed laser beam next applied is absorbed by C previously produced to continue the decomposition of SiC into Si and C in a chain reaction manner with the relative movement of the SiC ingot and the focal point in the first direction; a separation surface forming step of relatively indexing the SiC ingot and the focal point in the second direction and performing the modified layer forming step plural times to thereby form a separation surface inside the SiC ingot; a wafer producing step of separating a part of the SiC ingot along the separation surface as an interface to thereby produce the SiC wafer; a chamfering step of chamfering the outer circumference of the SiC wafer separated from the SiC ingot, thereby removing a burr formed at the outer circumference of the SiC wafer; and a grinding step of grinding the separation surface of the SiC wafer separated from the SiC ingot after performing the chamfering step, thereby smoothing the separation surface of the SiC wafer.

In the SiC wafer producing method of the present invention, the modified layer forming step is performed to form a linear modified layer in the same c-plane and cracks propagating from the modified layer in opposite directions along the c-plane. Thereafter, the SiC ingot and the focal point are relatively moved in the second direction (indexing direction) where the off angle is formed, and the modified layer forming step is similarly performed plural times to thereby form a plurality of similar modified layers extending in the first direction and similar cracks propagating from these modified layers, wherein any adjacent ones of these modified layers are connected by the cracks in the second direction. Accordingly, these plural modified layers and cracks constitute a separation surface formed in the SiC ingot. Thereafter, a part of the SiC ingot is separated along this separation surface as an interface, thus easily producing a SiC wafer having a desired thickness from the SiC ingot. Accordingly, in the SiC wafer producing method of the present invention, the productivity can be sufficiently improved and the amount of an ingot portion to be discarded can be sufficiently reduced to approximately 30%.

In the modified layer forming step, the modified layer is initially formed at the focal point of the laser beam and next formed at a depth shallower than the focal point. That is, the laser beam starts to be applied at one end (outer edge) of the SiC ingot in the first direction. In an initial area from the one end to a position distant from the one end by tens of µm in the first direction, the modified layer is formed so as to gradually rise from the depth of the focal point. When the power density of the laser beam in the SiC ingot reaches a predetermined value at a predetermined depth, the rise of the modified layer in the initial area is stopped and the modified layer is next stably formed at this predetermined depth.

Accordingly, when a part of the SiC ingot is separated along the separation surface as an interface in the wafer producing step, a burr is formed at the outer circumference of the SiC wafer so as to project from the separation surface of the SiC wafer due to the rise of the modified layer in the initial area in the separation surface forming step. If the burr is left on the SiC wafer, there arises a problem such that abrasive members come into contact with the burr in the grinding step to cause stress concentration at the base of the burr, so that a processing quality may be reduced, e.g., the SiC wafer may be broken in the grinding step. To the contrary, in the SiC wafer producing method of the present invention, the chamfering step is performed before performing the grinding step to chamfer the outer circumference of the SiC wafer separated from the SiC ingot, thereby removing the burr. Accordingly, there is no possibility that the burr formed at the outer circumference of the SiC wafer may interfere with the grinding step, so that the grinding step can be smoothly performed. As a result, the processing quality can be made stable and the productivity can be improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
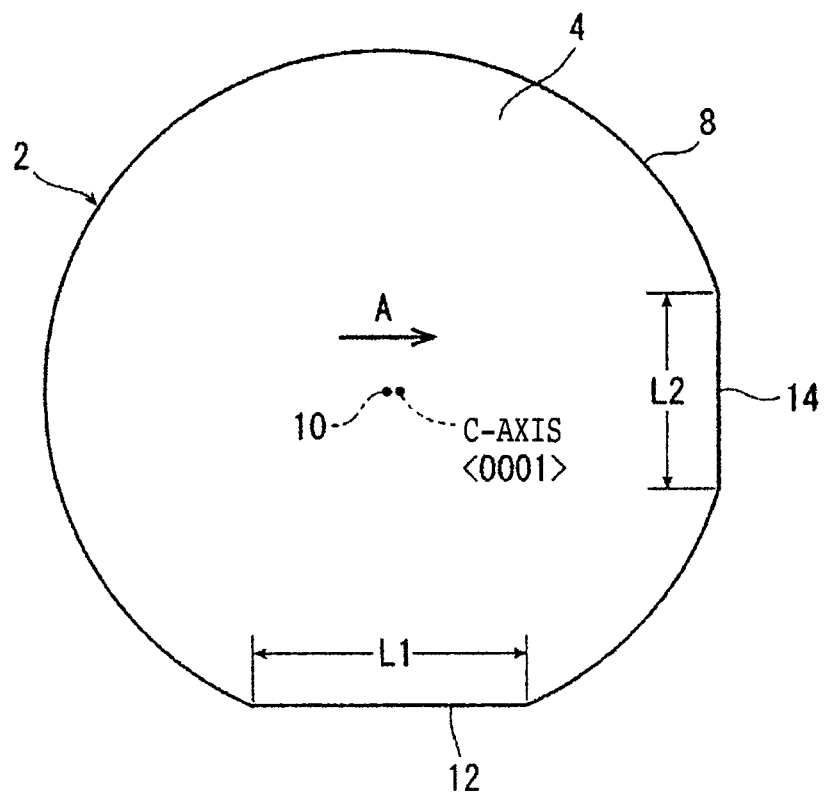
FIG. 1A is a plan view of a single crystal SiC ingot.
Figure 1B:
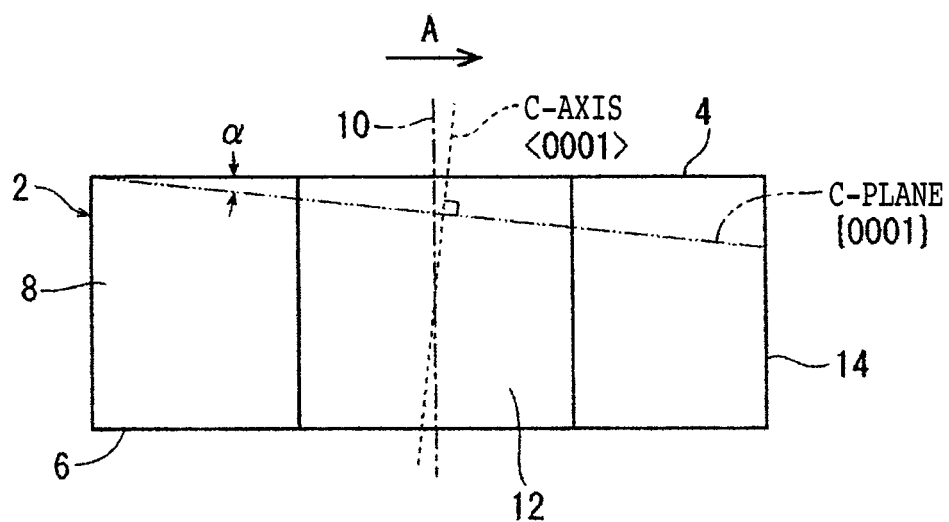
FIG. 1B is an elevational view of the SiC ingot depicted in FIG. 1A.

A preferred embodiment of the SiC wafer producing method according to the present invention will now be described with reference to the drawings. FIGS. 1A and 1B depict a generally cylindrical hexagonal single crystal SiC ingot 2 (which will be hereinafter referred to simply as "ingot 2") as a workpiece to be processed. The ingot 2 has a substantially circular first surface 4, a substantially circular second surface 6 opposite to the first surface 4, a substantially cylindrical surface 8 formed so as to connect the first surface 4 and the second surface 6, a c-axis (<0001> direction) extending from the first surface 4 to the second surface 6, and a c-plane ({0001} plane) perpendicular to the c-axis. In the ingot 2, the c-axis is inclined by an off angle α with respect to a normal 10 to the first surface 4. The off angle α (e.g., α=4°) is formed between the c-plane and the first surface 4 (the direction of formation of the off angle α is depicted by an arrow A in FIGS. 1A and 1B). Further, the cylindrical surface 8 of the ingot 2 is formed with a first orientation flat 12 and a second orientation flat 14, which are rectangular in side elevation and function to indicate crystal orientation. The first orientation flat 12 is parallel to the direction A of formation of the off angle α, and the second orientation flat 14 is perpendicular to the direction A of formation of the off angle α. As depicted in FIG. 1A, which is a plan view taken in the direction of the normal 10, the length L2 of the second orientation flat 14 is set shorter than the length L1 of the first orientation flat 12 (L2<L1).

Figure 2A:
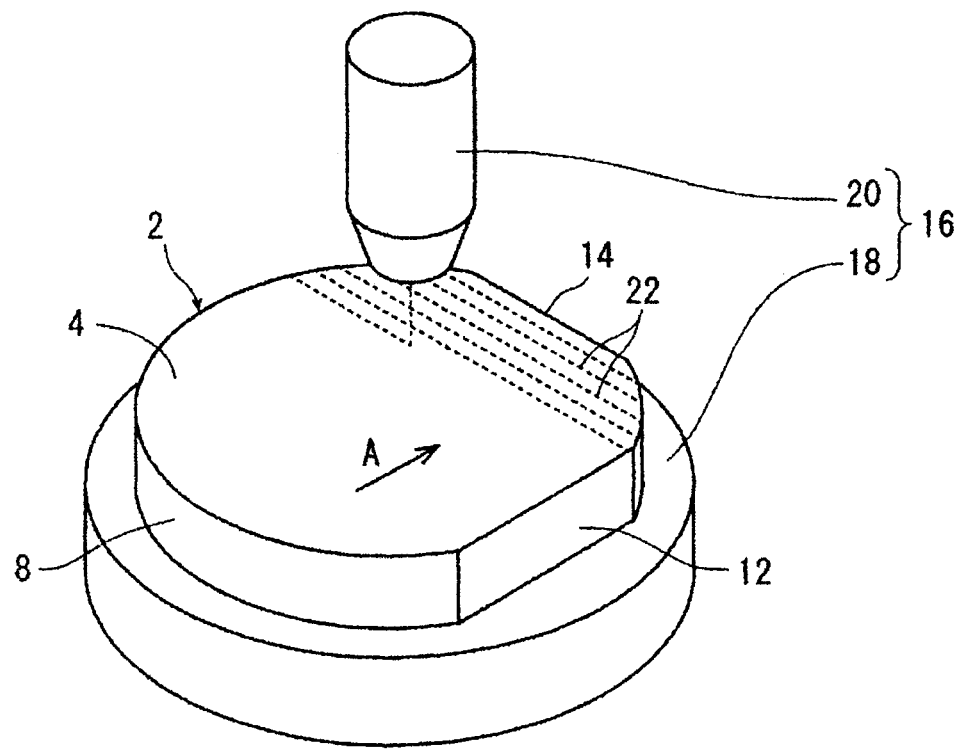
FIG. 2A is a perspective view depicting a separation surface forming step.
Figure 2A:

In this preferred embodiment, a separation surface forming step is first performed to form a separation surface inside the ingot 2 at a predetermined depth corresponding to the thickness of a wafer to be produced. The separation surface forming step may be performed by using a laser processing apparatus 16, a part of which is depicted in FIG. 2A. The laser processing apparatus 16 includes a chuck table 18 and focusing means 20. The chuck table 18 is adapted to be rotated about a vertical axis by rotating means (not depicted). Further, the chuck table 18 is adapted to be moved both in an X direction by X moving means (not depicted) and in a Y direction by Y moving means (not depicted). The focusing means 20 includes a focusing lens (not depicted) for focusing a pulsed laser beam LB oscillated from a pulsed laser beam oscillator (not depicted) included in the laser processing apparatus 16, wherein the pulsed laser beam LB focused by the focusing lens is applied to the ingot 2 as a workpiece. The X direction is defined as the direction depicted by an arrow X in FIGS. 2A and 2B, and the Y direction is defined as the direction depicted by an arrow Y in FIG. 2A, which is perpendicular to the X direction in an XY plane. The XY plane defined by the X direction and the Y direction is a substantially horizontal plane.

In the separation surface forming step, the ingot 2 is fixed to the chuck table 18 in the condition where an adhesive (e.g., epoxy resin adhesive) is interposed between the second surface 6 of the ingot 2 and the upper surface of the chuck table 18. As a modification, the upper surface of the chuck table 18 may be formed with a plurality of suction holes, whereby a suction force may be produced on the upper surface of the chuck table 18 to thereby hold the ingot 2 under suction. Thereafter, the chuck table 18 is moved to a position below imaging means (not depicted) included in the laser processing apparatus 16, and the imaging means is next operated to image the ingot 2 held on the chuck table 18 in the condition where the first surface 4 is oriented upward. Thereafter, the X moving means, the Y moving means, and the rotating means are operated to move and rotate the chuck table 18 according to the image of the ingot 2 detected by the imaging means, thereby adjusting the orientation of the ingot 2 to a predetermined orientation and also adjusting the positional relation between the ingot 2 and the focusing means 20 in the XY plane.

Figure 2B:
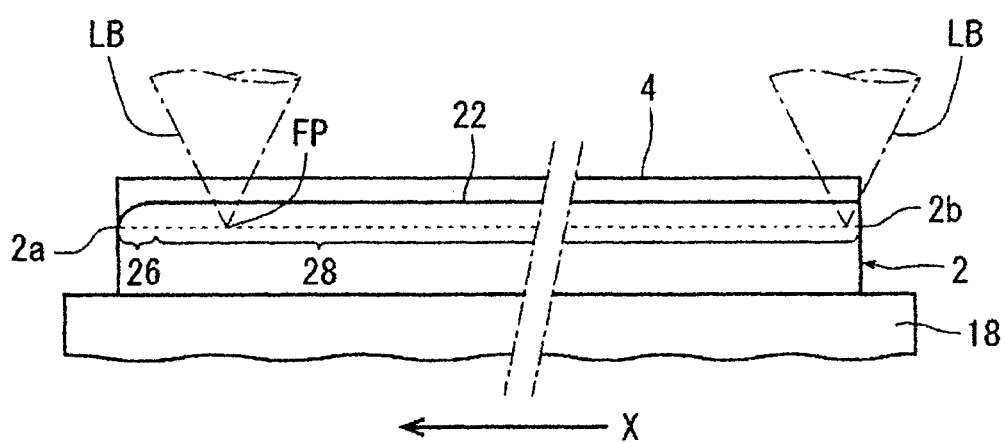
FIG. 2B is an elevational view depicting the separation surface forming step.

In adjusting the orientation of the ingot 2 to a predetermined orientation, the first orientation flat 12 is made parallel to the Y direction and the second orientation flat 14 is made parallel to the X direction as depicted in FIG. 2A. Accordingly, the direction A of formation of the off angle α is made parallel to the Y direction, and the direction perpendicular to the direction A of formation of the off angle α is made parallel to the X direction. Thereafter, focal position adjusting means (not depicted) included in the laser processing apparatus 16 is operated to vertically move the focusing means 20, thereby setting a focal point FP at a predetermined depth from the first surface 4, wherein this predetermined depth corresponds to the thickness of a wafer to be produced. Thereafter, as depicted in FIG. 2B, a pulsed laser beam LB having a transmission wavelength to SiC is applied from the focusing means 20 to the ingot 2 as moving the chuck table 18 relative to the focal point FP at a predetermined feed speed in the X direction (i.e., in the direction perpendicular to the direction A of formation of the off angle α) by operating the X moving means. As a result, a modified layer 22 is formed inside the ingot 2 along a line in the X direction, and cracks 24 (see FIG. 3C) are also formed so as to extend from the modified layer 22 (modified layer forming step).

In the modified layer forming step, the pulsed laser beam LB is initially applied to the ingot 2 to thereby decompose SiC into Si (silicon) and C (carbon). Thereafter, the pulsed laser beam LB is next applied to the ingot 2 and absorbed by C previously produced. Thus, SiC is decomposed into Si and C in a chain reaction manner with the movement of the chuck table 18 in the X direction to thereby linearly form the modified layer 22 extending in the X direction. At the same time, the cracks 24 are also formed so as to propagate from the modified layer 22 in opposite directions along the c-plane. In the modified layer forming step, the chuck table 18 is fed in the X direction so that the adjacent spots of the pulsed laser beams LB applied to the ingot 2 are overlapped with each other at the depth where the modified layer 22 is formed. Accordingly, the pulsed laser beam LB is applied again to the modified layer 22 where SiC has been decomposed into Si and C. To ensure that the adjacent spots of the pulsed laser beam LB are overlapped with each other in the modified layer forming step, the relation of $G=(V/F)-D<0$ must hold, where F is the repetition frequency (Hz) of the pulsed laser beam LB, V is the feed speed (mm/second) of the chuck table 18, and D is the diameter (mm) of each spot. Further, the overlap rate of the adjacent spots is defined as $|G|/D$.

As depicted in FIG. 2B, the modified layer 22 is initially formed at the focal point FP of the pulsed laser beam LB and next formed at a depth shallower than the focal point FP. More specifically, the pulsed laser beam LB starts to be applied at one end 2a of the ingot 2 in the X direction. In an initial area 26 from the one end 2a to a position distant from the one end 2a by tens of μm in the X direction, the modified layer 22 is formed so as to gradually rise by approximately 30 to 50 μm from the depth of the focal point FP. The line along which the focal point FP is relatively moved in the ingot 2 is depicted by a broken line in FIG. 2B. When the power density of the pulsed laser beam LB in the ingot 2 reaches a predetermined value at a predetermined depth, the rise of the modified layer 22 in the initial area 26 is stopped and the modified layer 22 is next stably formed at this predetermined depth in a stable area 28 other than the initial area 26. That is, the stable area 28 is an area extending from the end of the initial area 26 to the other end 2b of the ingot 2 in the X direction. Thus, in the modified layer forming step, the modified layer 22 is initially formed so as to rise in the initial area 26 and next stably formed at the predetermined depth in the stable area 28, wherein this predetermined depth is shallower than the focal point FP of the pulsed laser beam LB (i.e., toward the first surface 4 as a laser beam applied surface), and the power density of the pulsed laser beam LB becomes a predetermined value at this predetermined depth. The power density E (J/cm²) is defined by the average power P (W), the area $S=\Pi D^2/4$ (cm²) of the spot at the position where the modified layer 22 is stably formed, i.e., at the predetermined depth shallower than the focal point FP, and the repetition frequency F (Hz) to give $E=P/(S \cdot F)$.

Figure 3A:
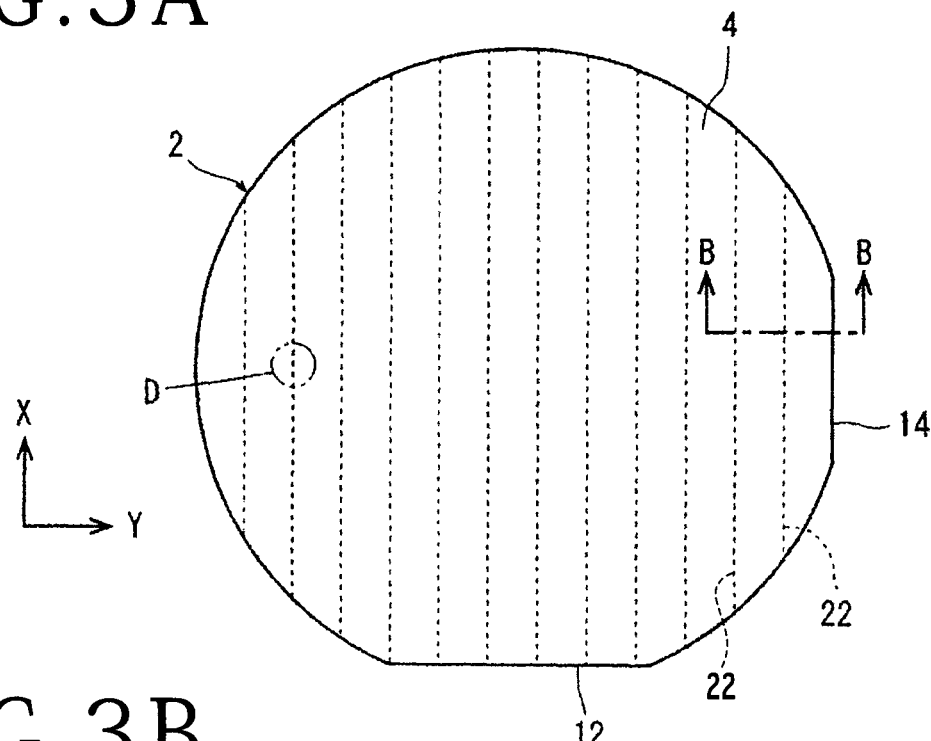
FIG. 3A is a plan view of the SiC ingot in which a separation surface has been formed in the separation surface forming step.
Figure 3B:
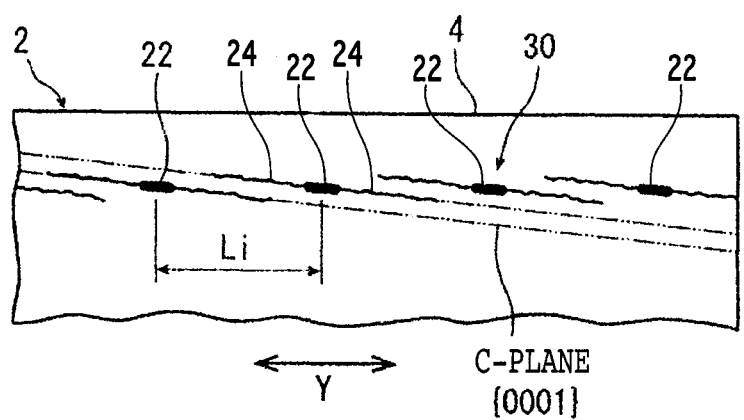
FIG. 3B is a cross section taken along the line B-B in FIG. 3A.
Figure 3C:
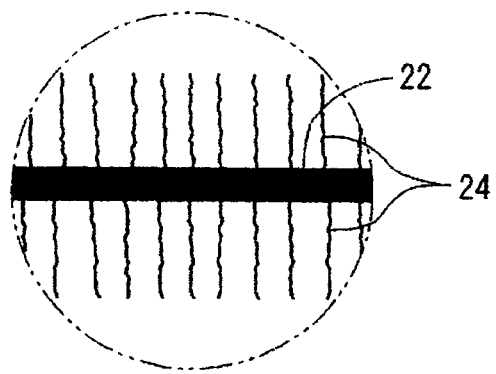
FIG. 3C is an enlarged view of an encircled portion D depicted in FIG. 3A.

After performing the modified layer forming step along a line in the X direction, indexing is performed in such a manner that the chuck table 18 is moved relative to the focal point FP by a predetermined index amount Li (see FIG. 3B) in the Y direction (i.e., in the direction A of formation of the off angle α) by operating the Y moving means. Thereafter, the modified layer forming step is similarly performed along the next line in the X direction. Thereafter, the indexing and the modified layer forming step are repeated plural times to thereby form a separation surface 30 inside the ingot 2 at the predetermined depth corresponding to the thickness of a wafer to be produced as depicted in FIG. 3B, wherein the separation surface 30 is composed of plural modified layers 22 and cracks 24. In the separation surface 30, any adjacent ones of the plural modified layers 22 are connected through the cracks 24 in the direction A of formation of the off angle α. For example, the separation surface forming step is performed under the following laser processing conditions.

Figure 4A:
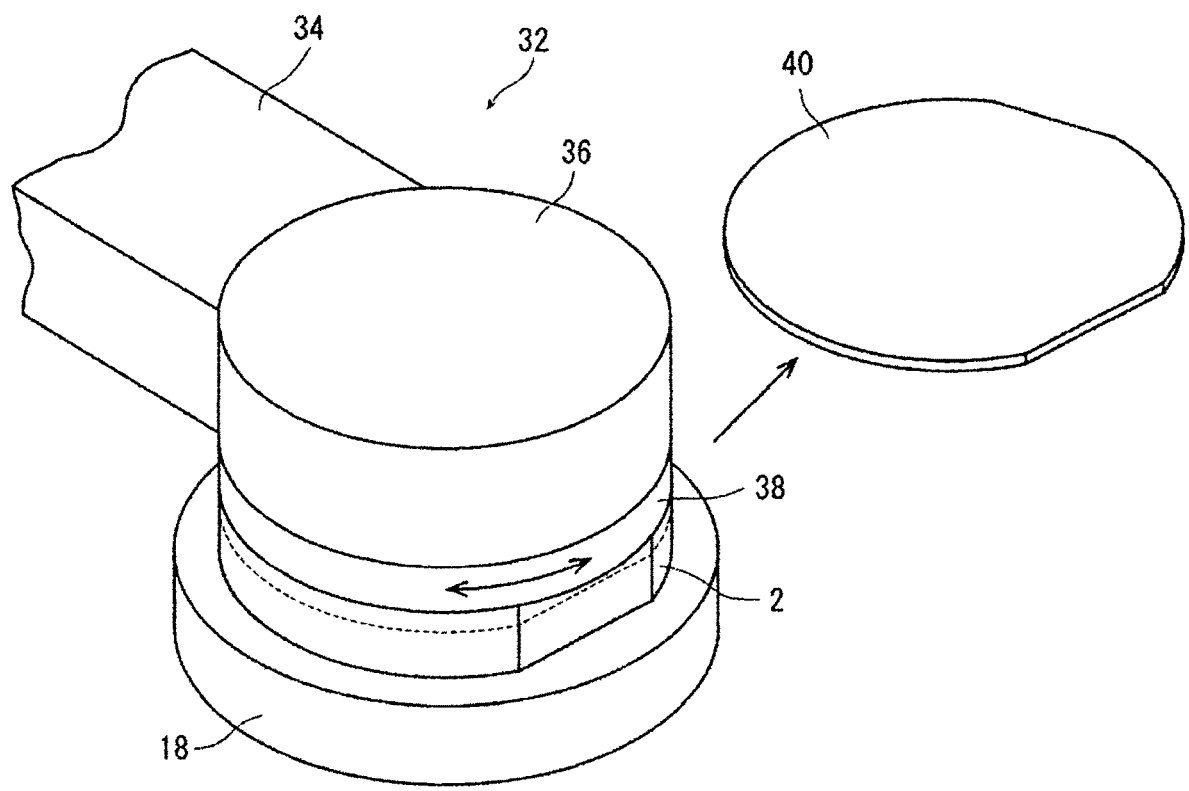
FIG. 4A is a perspective view depicting a wafer producing step.

Wavelength of the pulsed laser beam: 1064 nm
Repetition frequency: 80 kHz
Average power: 3.2 W
Pulse width: 4 ns
Diameter of the focal point: 3 μm
Numerical aperture (NA) of the focusing lens: 0.43
Index amount: 250 to 400 μm
Feed speed: 120 to 260 mm/second After performing the separation surface forming step, a wafer producing step is performed to separate a part of the ingot 2 along the separation surface 30 as an interface, thereby producing a wafer. The wafer producing step may be performed by using a separating apparatus 32, a part of which is depicted in FIG. 4A. The separating apparatus 32 includes an arm 34 extending in a substantially horizontal direction and a motor 36 provided at the front end of the arm 34. A disk-shaped suction member 38 is connected to the lower surface of the motor 36 so as to be rotatable about a vertical axis. The suction member 38 has a lower surface adapted to hold a workpiece under suction. Further, ultrasonic vibration applying means (not depicted) is built in the suction member 38 to apply ultrasonic vibration to the lower surface of the suction member 38.

Figure 4B:
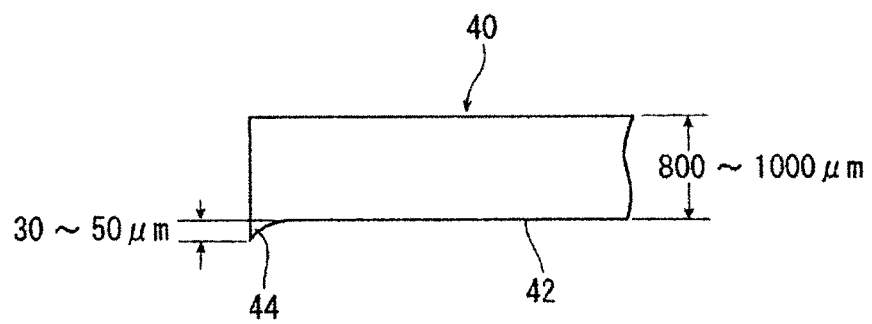
FIG. 4B is a sectional view of a part of a wafer separated from the SiC ingot in the wafer producing step.

In the wafer producing step, the X moving means and the Y moving means of the laser processing apparatus 16 are first operated to move the chuck table 18 to a position below the suction member 38 of the separating apparatus 32. Thereafter, elevating means (not depicted) included in the separating apparatus 32 is operated to lower the arm 34 until the lower surface of the suction member 38 comes into close contact with the first surface 4 of the ingot 2 as depicted in FIG. 4A. Thereafter, suction means (not depicted) connected to the suction member 38 is operated to hold the first surface 4 of the ingot 2 to the lower surface of the suction member 38 under suction. Thereafter, the ultrasonic vibration applying means built in the suction member 38 is operated to apply ultrasonic vibration to the lower surface of the suction member 38. At the same time, the motor 36 is operated to rotate the suction member 38. As a result, a part of the ingot 2 can be separated along the separation surface 30 as an interface to thereby produce a wafer 40 having a desired thickness (e.g., 800 to 1000 μm) as depicted in FIG. 4A. As depicted in FIG. 4B, the wafer 40 has a separation surface 42 along which the wafer 40 has been separated from the ingot 2. Due to the rise of the modified layer 22 in the initial area 26 in the separation surface forming step as depicted in FIG. 2B, a burr 44 is formed at the outer circumference of the separation surface 42 of the wafer 40 so as to project from the separation surface 42 by approximately 30 to 50 μm as depicted in FIG. 4B.

Figure 5A:
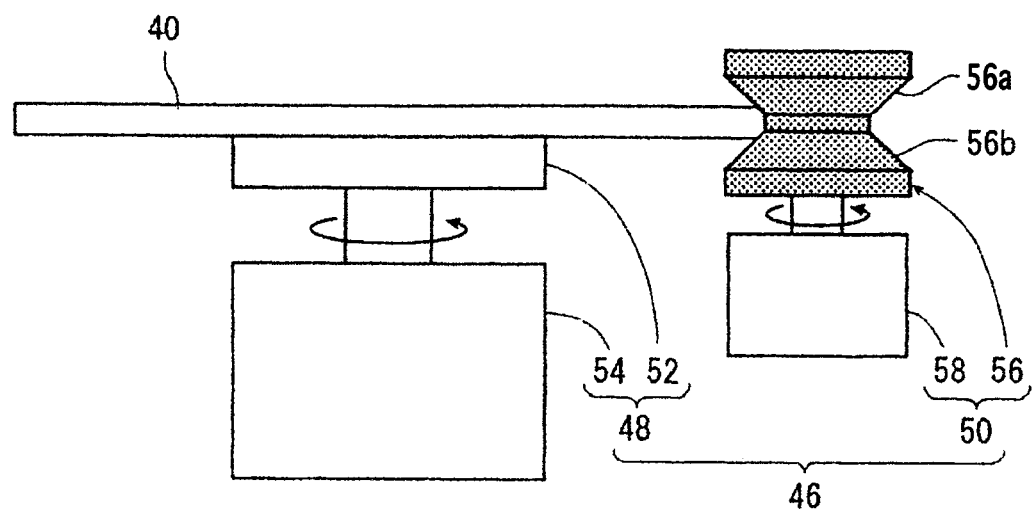
FIG. 5A is an elevational view depicting a chamfering step.

After performing the wafer producing step, a chamfering step is performed to chamfer the outer circumference of the wafer 40 separated from the ingot 2, thereby removing the burr 44. In the SiC wafer producing method of the present invention, it is important to perform the chamfering step before performing a grinding step to be hereinafter described. The chamfering step may be performed by using a chamfering apparatus 46, a part of which is depicted in FIG. 5A. The chamfering apparatus 46 includes holding means 48 and chamfering means 50. The holding means 48 includes a circular chuck table 52 and a motor 54 for rotating the chuck table 52 about a vertical axis. The chuck table 52 has a diameter smaller than the diameter of the wafer 40. The chuck table 52 has an upper surface adapted to hold the wafer 40 as a workpiece under suction. The chamfering means 50 includes an abrasive member 56 and a motor 58 for rotating the abrasive member 56 about a vertical axis. The abrasive member 56 has a shape such that a vertically intermediate portion thereof is constricted. That is, the abrasive member 56 has an upper portion 56a having an inverted frustoconical shape such that the diameter of the upper portion 56a is gradually decreased from the upper end toward the lower end and a lower portion 56b having a frustoconical shape such that the diameter of the lower portion 56b is gradually increased from the upper end toward the lower end. The lower end of the upper portion 56a is connected to the upper end of the lower portion 56b.

Figure 5B:
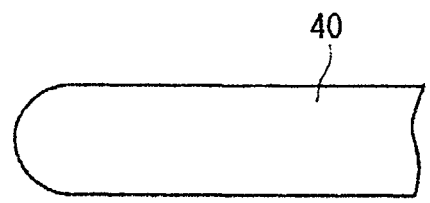
FIG. 5B is a sectional view of a part of the wafer processed by the chamfering step.

In the chamfering step, the wafer 40 is first held on the upper surface of the chuck table 52 under suction in the condition where the center of the wafer 40 coincides with the center of rotation of the chuck table 52. Thereafter, the motor 54 is operated to rotate the chuck table 52 at a predetermined speed (e.g., 10 rpm) counterclockwise as viewed from the upper side of the chuck table 52. Further, the motor 58 is operated to rotate the abrasive member 56 at a predetermined speed (e.g., 500 rpm) counterclockwise as viewed from the upper side of the abrasive member 56. Thereafter, moving means (not depicted) included in the chamfering apparatus 46 is operated to move the chamfering means 50 toward the holding means 48 until the upper portion 56a and the lower portion 56b of the abrasive member 56 come into contact with the outer circumference of the wafer 40. After the abrasive member 56 comes into contact with the outer circumference of the wafer 40, the chamfering means 50 is fed at a predetermined feed speed against the outer circumference of the wafer 40 by operating the moving means. Accordingly, as depicted in FIG. 5B, the upper edge and the lower edge of the outer circumference of the wafer 40 can be chamfered at the same time to thereby remove the burr 44. As a modification, the upper edge of the outer circumference of the wafer 40 may be first chamfered and the lower edge of the outer circumference of the wafer 40 may be next chamfered.

Figure 6:
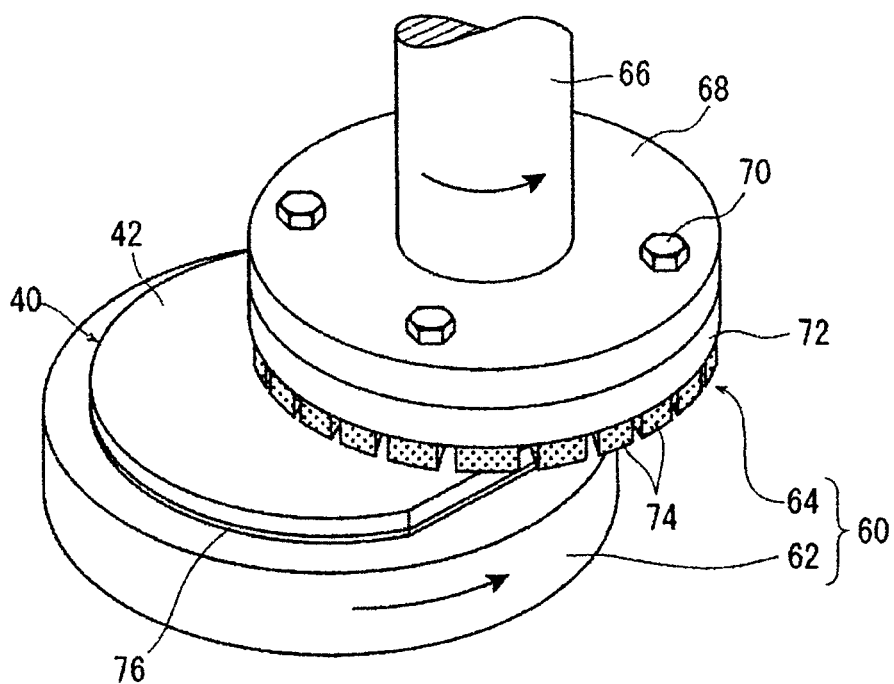
FIG. 6 is a perspective view depicting a grinding step.

After performing the chamfering step, a grinding step is performed to grind the separation surface 42 of the wafer 40 separated from the ingot 2, thereby smoothing the separation surface 42. The grinding step may be performed by using a grinding apparatus 60, a part of which is depicted in FIG. 6.

The grinding apparatus 60 includes a chuck table 62 and grinding means 64. The chuck table 62 has an upper surface adapted to hold the wafer 40 as a workpiece under suction. The chuck table 62 is adapted to be rotated about a vertical axis by rotating means (not depicted). The grinding means 64 includes a cylindrical spindle 66 extending vertically and connected to a motor (not depicted) and a disk-shaped wheel mount 68 fixed to the lower end of the spindle 66. An annular grinding wheel 72 is fixed by bolts 70 to the lower surface of the wheel mount 68. A plurality of abrasive members 74 are fixed to the lower surface of the grinding wheel 72 so as to be arranged annularly at given intervals along the outer circumference of the grinding wheel 72. As depicted in FIG. 6, the center of rotation of the grinding wheel 72 is deviated from the center of rotation of the chuck table 62.

In the grinding step, a protective member 76 formed of synthetic resin is attached to the other surface of the wafer 40 opposite to the separation surface 42. Thereafter, the wafer 40 with the protective member 76 attached thereto is held on the upper surface of the chuck table 62 under suction in the condition where the protective member 76 is oriented downward (i.e., the separation surface 42 is oriented upward). Thereafter, the rotating means is operated to rotate the chuck table 62 at a predetermined speed (e.g., 500 rpm) counterclockwise as viewed from the upper side of the chuck table 62. Further, the motor is operated to rotate the spindle 66 at a predetermined speed (e.g., 3000 rpm) counterclockwise as viewed from the upper side of the spindle 66. Thereafter, elevating means (not depicted) included in the grinding apparatus 60 is operated to lower the spindle 66 until the abrasive members 74 come into contact with the separation surface 42 of the wafer 40. After the abrasive members 74 come into contact with the separation surface 42 of the wafer 40, the spindle 66 is lowered at a predetermined feed speed (e.g., 0.1 μm/second). Accordingly, the separation surface 42 of the wafer 40 can be finished to a smooth surface.

As described above, in the SiC wafer producing method of the present invention, a part of the ingot 2 can be separated along the separation surface 30 as an interface, wherein the separation surface 30 is composed of the plural modified layers 22 and the cracks 24, thereby easily producing the wafer 40 having a desired thickness. Accordingly, the productivity can be sufficiently improved and the amount of an ingot portion to be discarded can be sufficiently reduced to approximately 30%. Furthermore, in the SiC wafer producing method of the present invention, the chamfering step is performed before performing the grinding step, so as to chamfer the outer circumference of the wafer 40 separated from the ingot 2, thereby removing the burr 44. Accordingly, there is no possibility that the burr 44 may interfere with the grinding step, so that the grinding step can be smoothly performed. As a result, the processing quality can be made stable and the productivity can be improved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An SiC wafer producing method for producing an SiC wafer from a single crystal SiC ingot having a first surface, a second surface opposite to the first surface, a c-axis extending from the first surface to the second surface, and a c-plane perpendicular to the c-axis, the c-axis being inclined by an off angle with respect to a normal to the first surface, the off angle being formed between the c-plane and the first surface, the SiC wafer producing method comprising:

a modified layer forming step of setting a focal point of a pulsed laser beam having a transmission wavelength to SiC inside the SiC ingot at an initial depth from the first surface and applying the pulsed laser beam to the SiC ingot while relatively moving the SiC ingot and the focal point at the initial depth in a first direction through an initial area until a power density of the pulsed laser beam reaches a predetermined value at a predetermined depth from the first surface, the initial depth being greater than the predetermined depth from the first surface, and next applying the pulsed laser beam with the power density at the predetermined value to the SiC ingot as relatively moving the SiC ingot and the focal point at the initial depth through a stable area in the first direction perpendicular to a second direction where the off angle is formed, thereby forming a linear modified layer inside the SiC ingot that rises from the initial depth to the predetermined depth in the initial area and that extends at the predetermined depth in the stable area, so as to extend in the first direction and cracks extending from the modified layer in opposite directions along the c-plane, the modified layer being formed in such a manner that SiC is decomposed into Si and C by the pulsed laser beam first applied, and the pulsed laser beam next applied is absorbed by C previously produced to continue the decomposition of SiC into Si and C in a chain reaction manner with the relative movement of the SiC ingot and the focal point in the first direction;

a separation surface forming step of relatively indexing the SiC ingot and the focal point in the second direction and performing the modified layer forming step plural times to thereby form a separation surface inside the SiC ingot;

a wafer producing step of separating a part of the SiC ingot along the separation surface as an interface to thereby produce the SiC wafer;

a chamfering step of chamfering the outer circumference of the SiC wafer separated from the SiC ingot, thereby removing a burr formed by the modified layers formed in the initial areas at the outer circumference of the SiC wafer; and a grinding step of grinding the separation surface of the SiC wafer separated from the SiC ingot after performing the chamfering step, thereby smoothing the separation surface of the SiC wafer.

2. The SiC wafer producing method as defined in claim 1 wherein a difference between the initial depth and the predetermined depth is approximately 30 to 50 µm.

* * * * *